(12) United States Patent
Sakai et al.

(10) Patent No.: US 10,056,247 B2
(45) Date of Patent: Aug. 21, 2018

(54) METHOD OF MANUFACTURING SILICON CARBIDE SEMICONDUCTOR DEVICE

(71) Applicant: Sumitomo Electric Industries, Ltd., Osaka (JP)

(72) Inventors: Mitsuhiko Sakai, Osaka (JP); Hiroyuki Kitabayashi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/527,619

(22) PCT Filed: Oct. 7, 2015

(86) PCT No.: PCT/JP2015/078456
§ 371 (c)(1),
(2) Date: May 17, 2017

(87) PCT Pub. No.: WO2016/080102
PCT Pub. Date: May 26, 2016

(65) Prior Publication Data
US 2017/0338100 A1    Nov. 23, 2017

(30) Foreign Application Priority Data
Nov. 19, 2014    (JP) ................................ 2014-234840

(51) Int. Cl.
| H01L 21/00 | (2006.01) |
| H01L 21/02 | (2006.01) |
| H01L 21/04 | (2006.01) |
| H01L 21/683 | (2006.01) |
| H01L 21/768 | (2006.01) |
| H01L 21/67 | (2006.01) |
| H01L 29/16 | (2006.01) |

(52) U.S. Cl.
CPC .... H01L 21/02035 (2013.01); H01L 21/0445 (2013.01); H01L 21/67092 (2013.01); H01L 21/6836 (2013.01); H01L 21/76865 (2013.01); H01L 29/1608 (2013.01)

(58) Field of Classification Search
CPC .......... H01L 21/02035; H01L 21/0445; H01L 21/67092; H01L 21/6836; H01L 21/76865; H01L 21/02378; H01L 21/02433; H01L 29/1608; H01L 29/78684; H01L 29/12
See application file for complete search history.

(56) References Cited

U.S. PATENT DOCUMENTS

| 2012/0138951 A1 | 6/2012 | Hayashi et al. |
| 2015/0099428 A1* | 4/2015 | Fujita .................... B24B 9/065 |
| | | 451/28 |

FOREIGN PATENT DOCUMENTS

| JP | 2002-246334 A | 8/2002 |
| JP | 2012-227234 | 11/2012 |

(Continued)

*Primary Examiner* — Nikolay Yushin
(74) *Attorney, Agent, or Firm* — Venable LLP; Michael A. Sartori; Laura G. Remus

(57) ABSTRACT

In accordance with the following step of a method of manufacturing a MOSFET, a first cutting step of cutting a silicon carbide wafer along a plane substantially parallel to a {11-20} plane is performed. After the first cutting step, a second cutting step of cutting the silicon carbide wafer along a plane substantially perpendicular to the {11-20} plane and substantially perpendicular to the first main surface is performed.

7 Claims, 9 Drawing Sheets

(56) References Cited

FOREIGN PATENT DOCUMENTS

| JP | 2013-051298 A | 3/2013 |
|---|---|---|
| JP | 2014-011342 A | 1/2014 |
| JP | 2014-086446 A | 5/2014 |
| JP | 2014-192463 | 10/2014 |
| WO | 2011/145309 A1 | 11/2011 |

* cited by examiner

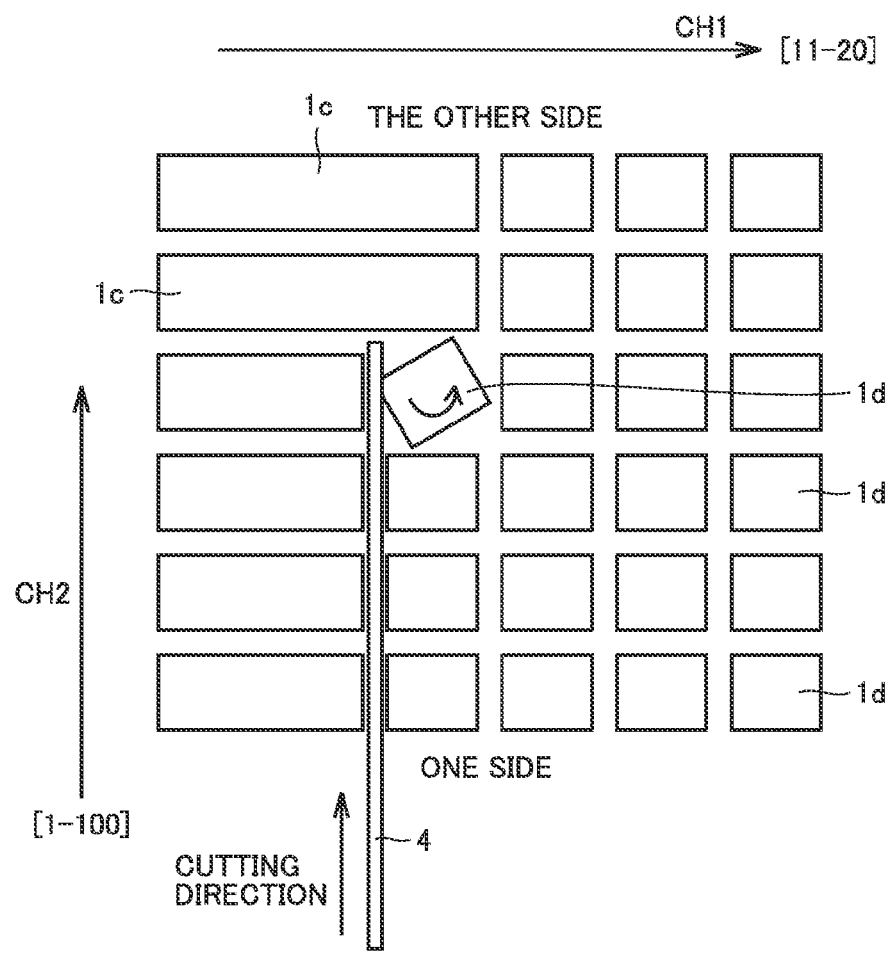

METHOD OF MANUFACTURING SILICON CARBIDE SEMICONDUCTOR DEVICE

TECHNICAL FIELD

The present invention relates to methods of manufacturing silicon carbide semiconductor devices.

BACKGROUND ART

In recent years, silicon carbide has been increasingly employed as a material forming a semiconductor device in order to allow for a higher breakdown voltage, lower loss and the use in a high-temperature environment and the like of the semiconductor device.

Japanese Patent Laying-Open No. 2014-86446 (PTD 1), for example, describes a method of cutting a silicon carbide wafer. According to this method of cutting a silicon carbide wafer, a silicon carbide wafer is cut along a direction perpendicular to a straight line formed by a {1-210} plane on the c-plane, and then the silicon carbide wafer is cut along a direction parallel to the {1-210} plane on the c-plane.

CITATION LIST

Patent Document

PTD 1: Japanese Patent Laying-Open No. 2014-86446

SUMMARY OF INVENTION

Technical Problem

However, even with this method of cutting a silicon carbide wafer, it has been difficult to suppress the occurrence of chipping.

An object of one embodiment of the present invention is to provide a method of manufacturing a silicon carbide semiconductor device which can suppress the occurrence of chipping.

Solution to Problem

A method of manufacturing a silicon carbide semiconductor device according to one embodiment of the present invention includes the following steps. A silicon carbide wafer having a first main surface and a second main surface opposite to the first main surface is prepared. A first cutting step of cutting the silicon carbide wafer along a plane substantially parallel to a {11-20} plane is performed. After the first cutting step, a second cutting step of cutting the silicon carbide wafer along a plane substantially perpendicular to the {11-20} plane and substantially perpendicular to the first main surface is performed.

Advantageous Effects of Invention

According to the embodiment of the present invention, a method of manufacturing a silicon carbide semiconductor device which can suppress the occurrence of chipping can be provided.

BRIEF DESCRIPTION OF DRAWINGS

FIG. 14 is a schematic plan view showing a method of manufacturing a silicon carbide semiconductor device according to a comparative example.

DESCRIPTION OF EMBODIMENTS

Figure 1:
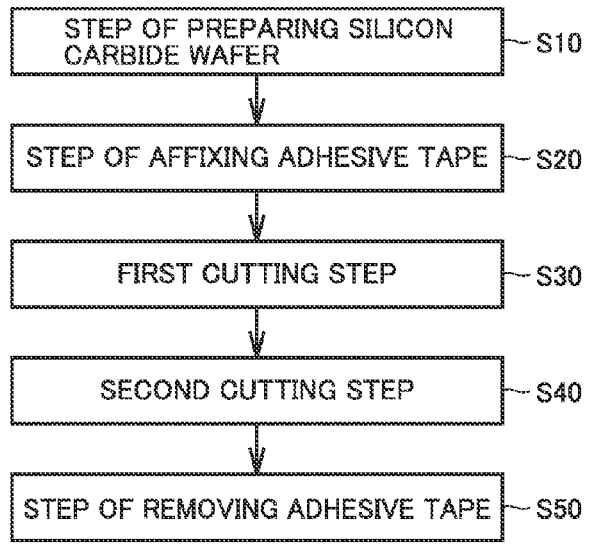
FIG. 1 is a flowchart schematically showing a method of manufacturing a silicon carbide semiconductor device according to an embodiment of the present invention.

[Description of Embodiment of the Present Invention]

The present inventors conducted a study as described below on the cause for chipping. First, a plurality of chips were formed by dicing a silicon carbide wafer using a method similar to that described in Japanese Patent Laying-Open No. 2014-86446. Specifically, first, an adhesive tape was affixed to the entire backside surface of the silicon carbide wafer. Then, as shown in FIG. 14, in a first cutting step, the entire silicon carbide wafer was cut at a prescribed interval along a [11-20] direction CH1 using a blade 4, to form a plurality of strip-like pieces 1c. Then, in a second cutting step, each of the plurality of strip-like pieces 1c was cut at a prescribed interval along a [1-100] direction CH2 perpendicular to the [11-20] direction using blade 4, to form a plurality of chips 1d. It is noted that the cutting plane of the silicon carbide wafer in the second cutting step is a {11-20} plane which is the cleavage plane of hexagonal silicon carbide. In each of the first cutting step and the second cutting step, the silicon carbide wafer is completely cut by the blade in a thickness direction of the silicon carbide wafer, whereas the adhesive tape is not completely cut but only partially cut in the thickness direction. The adhesive tape holds each of the chips formed by the cutting of the silicon carbide wafer so as to prevent the chips from flying.

A plurality of chips in which chipping occurred were examined under an optical microscope to study in detail the position where the chipping had occurred in each of the plurality of chips. As a result, it was found that there was a tendency for the chipping to occur at the same position in each of the plurality of chips. Specifically, when the silicon carbide wafer was cut using blade 4 from one side to the other side of a main surface of the silicon carbide wafer, the chipping tended to occur at a corner portion on the other side of chip 1d. When the silicon carbide wafer was cut along the {11-20} plane which is the cleavage plane of hexagonal silicon carbide in the second cutting step, pieces 1c of the silicon carbide wafer split at the cleavage plane to form quadrangular chips 1d before pieces 1c were mechanically cut by blade 4 to form quadrangular chips 1d. It is believed that this chip 1d rotates by being caught in rotating blade 4, causing chipping to occur at a corner portion on the other side of chip 1d.

The silicon carbide wafer is divided into a plurality of strip-like pieces in the first cutting step, and each of the plurality of strip-like pieces is divided into a plurality of chips in the second cutting step. In the first cutting step, a strip-like piece is held while having a large area of contact with the adhesive tape. For this reason, during the cutting of the silicon carbide wafer, the strip-like piece is less likely to rotate even when caught in the blade. On the other hand, in the second cutting step, a chip obtained by the division of the strip-like piece is held while having a smaller area of contact with the adhesive tape than that of the strip-like piece. For this reason, the chip is not fixed as strongly to the adhesive tape as the strip-like piece. It is thus believed that the chip is more likely to rotate by being caught in the blade during the cutting of the silicon carbide wafer.

The inventors thus conceived of cutting the silicon carbide wafer mechanically by the blade in the second cutting step, by cutting the silicon carbide wafer along a plane substantially perpendicular to the {11-20} plane which is the cleavage plane, instead of cutting the silicon carbide wafer by utilizing its cleavage. Consequently, during the cutting of the silicon carbide wafer by the blade, the chip can be prevented from rotating by being caught in the blade to cause chipping in the chip.

Next, the embodiment of the present invention will be listed and described.

(1) A method of manufacturing a silicon carbide semiconductor device according to one embodiment of the present invention includes the following steps. A silicon carbide wafer having a first main surface and a second main surface opposite to the first main surface is prepared. A first cutting step of cutting the silicon carbide wafer along a plane substantially parallel to a {11-20} plane is performed. After the first cutting step, a second cutting step of cutting the silicon carbide wafer along a plane substantially perpendicular to the {11-20} plane and substantially perpendicular to the first main surface is performed. It is noted that the plane substantially parallel to the {11-20} plane corresponds to a plane inclined only at an angle within 5°, for example, relative to the {11-20} plane. The plane substantially perpendicular to the {11-20} plane corresponds to a plane perpendicular to the {11-20} plane, which is inclined only at an angle within 5°, for example. The plane substantially perpendicular to the first main surface corresponds to a plane perpendicular to the first main surface, which is inclined only at an angle within 5°, for example. Consequently, in the second cutting step, the chips are formed by cutting the silicon carbide wafer mechanically by the blade, instead of cutting the silicon carbide wafer by utilizing the cleavage plane, thereby preventing the chips from being caught in the blade to cause chipping.

(2) Preferably, in the method of manufacturing a silicon carbide semiconductor device according to (1) above, the first main surface is a plane angled off by not less than 3° and not more than 5° relative to a {0001} plane toward an off direction. In the second cutting step, the silicon carbide wafer is cut substantially toward the off direction. It is noted that substantially the off direction corresponds to a direction inclined only at an angle within 5°, for example, from the off direction. Consequently, wear of the blade due to a surface step can be avoided, thereby further suppressing the occurrence of chipping caused by a distortion or a burr of the blade associated with the wear of the blade.

(3) Preferably, in the method of manufacturing a silicon carbide semiconductor device according to (1) or (2) above, in each of the first cutting step and the second cutting step, a cutting speed of the silicon carbide wafer in a direction parallel to the first main surface is not less than 1 mm/second and not more than 40 mm/second. By setting the cutting speed of the silicon carbide wafer to not less than 1 mm/second, the force on the silicon carbide wafer can be reduced, thereby preventing the chips from being caught in the blade. By setting the cutting speed of the silicon carbide wafer to not more than 40 mm/second, deterioration of the blade can be suppressed.

(4) Preferably, in the method of manufacturing a silicon carbide semiconductor device according to any one of (1) to (3) above, in each of the first cutting step and the second cutting step, the silicon carbide wafer is cut by a rotating blade. A rotational speed of the blade is not less than 5000 rpm and not more than 50000 rpm. By setting the rotational speed of the blade to not less than 5000 rpm, the force on the silicon carbide wafer can be reduced, thereby preventing the chips from being caught in the blade. By setting the rotational speed of the blade to not more than 50000 rpm, deterioration of the blade can be suppressed.

(5) Preferably, the method of manufacturing a silicon carbide semiconductor device according to any one of (1) to (4) above further includes a step of, after the step of preparing the silicon carbide wafer and before the first cutting step, affixing an adhesive tape to one of the first main surface and the second main surface. The adhesive tape has an adhesive portion in contact with the one of the surfaces, and a base material located opposite to the one of the surfaces as seen from the adhesive portion. In each of the first cutting step and the second cutting step, an incision having a depth of not less than 15% and not more than 50% of a thickness of the base material is formed in the base material. By setting the depth of the incision formed in the base material to not less than 15% of the thickness of the base material, the occurrence of an uncut portion in silicon carbide wafer 1 can be suppressed. Increasing the depth of the incision formed in the base material increases the distance between the chips in the direction parallel to the first main surface. The actual cutting position may thereby be displaced from a planned cutting position. By setting the depth of the incision formed in the base material to not more than 50% of the thickness of the base material, the displacement of the actual cutting position from the planned cutting position can be suppressed.

(6) Preferably, in the method of manufacturing a silicon carbide semiconductor device according to any one of (1) to (5) above, in the first cutting step, the entire silicon carbide wafer is cut at a prescribed interval to form a plurality of strip-like pieces as seen along a direction perpendicular to the first main surface. In the second cutting step, all of the plurality of pieces are cut at a prescribed interval to form a plurality of chips. The silicon carbide wafer can thus be separated into the chips in a short period of time.

(7) Preferably, in the method of manufacturing a silicon carbide semiconductor device according to any one of (1) to (5) above, the first cutting step and the second cutting step are alternately repeated. The chips of any size can thus be formed with any cutting method, thereby increasing the flexibility of the cutting method.

[Details of Embodiment of the Present Invention]

The embodiment of the present invention will be described below based on the drawings. It is noted that the same or corresponding parts are designated by the same reference numbers in the following drawings, and description thereof will not be repeated. Regarding crystallographic indications in the present specification, an individual orientation is represented by [ ], a group orientation is represented by < >, an individual plane is represented by ( ) and a group plane is represented by { }. In addition, a negative crystallographic index is normally expressed by putting "–" (bar) above a numeral, but is expressed by putting a negative sign before the numeral in the present specification.

A description will be given of a method of manufacturing a MOSFET (Metal Oxide Semiconductor Field Effect Transistor) as an example of a silicon carbide semiconductor device according to the embodiment of the present invention.

Figure 2:
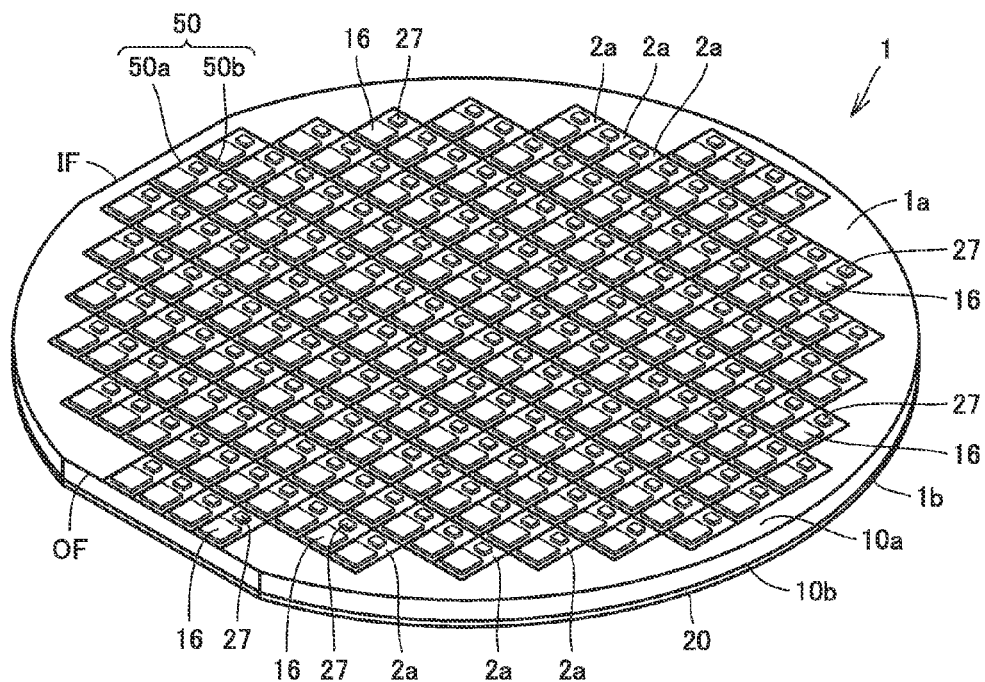
FIG. 2 is a schematic perspective view showing a first step of the method of manufacturing the silicon carbide semiconductor device according to the embodiment of the present invention.

First, a step of preparing a silicon carbide wafer (S10: FIG. 1) is performed. As shown in FIG. 2, a silicon carbide wafer 1 having a first main surface 1a and a second main surface 1b opposite to first main surface 1a is prepared. A plurality of semiconductor elements 2a are provided on silicon carbide wafer 1. Dicing lines 50 are provided on the first main surface 1a side of silicon carbide wafer 1. Dicing lines 50 include first dicing lines 50a extending along a particular direction (for example, a <1-100> direction) and second dicing lines 50b extending along a direction (for example, a <11-20> direction) perpendicular to the particular direction. The plurality of semiconductor elements 2a are configured such that they can be separated from one another by cutting silicon carbide wafer 1 along dicing lines 50, for example.

Silicon carbide wafer 1 may be provided with an orientation flat OF and an index flat IF. Orientation flat OF may extend along the <11-20> direction, for example. Index flat IF may extend along the <1-100> direction, for example. Silicon carbide wafer 1 includes a silicon carbide substrate 10 made of hexagonal silicon carbide. Each of the plurality of semiconductor elements 2a has, for example, a gate electrode 27 and a source electrode 16 exposed at its surface, and a drain electrode 20 exposed at its backside surface. Stated another way, gate electrode 27 and source electrode 16 are exposed at the first main surface 1a side of silicon carbide wafer 1, and drain electrode 20 is exposed at the second main surface 1b side of silicon carbide wafer 1.

Next, the configuration of a MOSFET as an example of semiconductor element 2a will be described.

Figure 3:
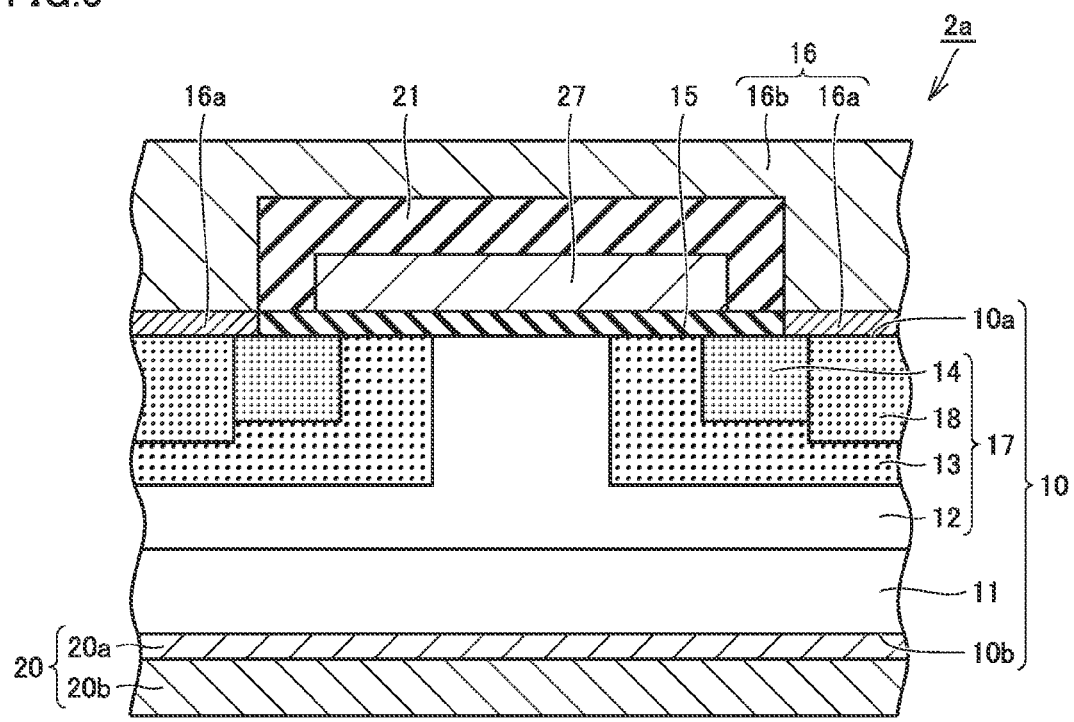
FIG. 3 is a schematic sectional view showing the configuration of a semiconductor element.

FIG. 3 is a schematic sectional view showing the configuration of semiconductor element 2a in a field of view (in sectional view) along a direction parallel to first main surface 1a of silicon carbide wafer 1. As shown in FIG. 3, the MOSFET as an example of semiconductor element 2a is a vertical type semiconductor element, for example, and mainly has silicon carbide substrate 10, gate electrode 27, a gate oxide film 15, an interlayer insulating film 21, source electrode 16, and drain electrode 20. Silicon carbide substrate 10 has a third main surface 10a and a fourth main surface 10b opposite to third main surface 10a, and mainly includes a silicon carbide single-crystal substrate 11, and a silicon carbide epitaxial layer 17 provided on silicon carbide single-crystal substrate 11.

Silicon carbide single-crystal substrate 11 is made of a hexagonal silicon carbide single crystal having a polytype of 4H, for example. Third main surface 10a of silicon carbide substrate 10 has a maximum diameter of greater than 100 mm, for example, and preferably of not less than 150 mm. Third main surface 10a of silicon carbide substrate 10 is a {0001} plane or a plane angled off by not more than 4° relative to the {0001} plane, for example. Specifically, third main surface 10a is a (0001) plane or a plane angled off by about not more than 4° relative to the (0001) plane, and fourth main surface 10b is a (000-1) plane or a plane angled off by about not more than 4° relative to the (000-1) plane. Silicon carbide substrate 10 has a thickness of not more than 600 μm, for example, and preferably of not more than 300 μm.

Silicon carbide epitaxial layer 17 has a drift region 12, a body region 13, a source region 14, and a contact region 18. Drift region 12 is an n type (first conductivity type) region including an n type impurity such as nitrogen. The n type impurity in drift region 12 has a concentration of about $5.0 \times 10^{15}$ cm$^{-3}$, for example. Body region 13 is a p type (second conductivity type) region including a p type impurity such as Al (aluminum) or B (boron). The p type impurity included in body region 13 has a concentration of about $1 \times 10^{17}$ cm$^{-3}$, for example.

Source region 14 is an n type region including an n type impurity such as phosphorus. Source region 14 is formed to be surrounded by body region 13 in a field of view (in plan view) seen along a direction perpendicular to third main surface 10a. The n type impurity included in source region 14 is higher in concentration than the n type impurity included in drift region 12. The n type impurity included in source region 14 has a concentration of $1 \times 10^{20}$ cm$^{-3}$, for example. Source region 14 is separated from drift region 12 by body region 13.

Contact region 18 is a p type region including a p type impurity such as aluminum. Contact region 18 is provided to be surrounded by source region 14 in plan view. Contact region 18 is in contact with body region 13. The p type impurity included in contact region 18 is higher in concentration than the p type impurity included in body region 13. The p type impurity included in contact region 18 has a concentration of $1 \times 10^{20}$ cm$^{-3}$, for example.

Gate oxide film 15 is formed in contact with third main surface 10a of silicon carbide substrate 10 so as to extend from an upper surface of one source region 14 to an upper surface of the other source region 14. Gate oxide film 15 is in contact with source region 14, body region 13 and drift region 12 at third main surface 10a of silicon carbide substrate 10. Gate oxide film 15 is made of silicon dioxide, for example. Gate oxide film 15 has a thickness of about not less than 40 nm and not more than 60 nm, for example.

Gate electrode 27 is arranged in contact with gate oxide film 15 so as to extend from above one source region 14 to above the other source region 14. Gate electrode 27 is provided on gate oxide film 15 so as to sandwich gate oxide film 15 between gate electrode 27 and silicon carbide substrate 10. Gate electrode 27 is formed on source region 14, body region 13 and drift region 12, with gate oxide film 15 interposed therebetween. Gate electrode 27 is formed of a conductor such as polysilicon doped with an impurity, for example.

Source electrode 16 has a source electrode portion 16a and a surface protecting electrode 16b. Source electrode portion 16a is in contact with source region 14 and contact region 18 at third main surface 10a of silicon carbide substrate 10. Source electrode portion 16a includes TiAlSi, for example. Preferably, source electrode portion 16a is in ohmic contact with each of source region 14 and contact region 18. Surface protecting electrode 16b is in direct contact with source electrode portion 16a, and is provided to cover interlayer insulating film 21. Surface protecting electrode 16b is electrically connected to source region 14 with source electrode 16 interposed therebetween.

Interlayer insulating film 21 is provided in contact with each of gate electrode 27 and gate oxide film 15 so as to cover gate electrode 27. Interlayer insulating film 21 electrically insulates gate electrode 27 and source electrode 16 from each other. Interlayer insulating film 21 is made of silicon dioxide, for example.

Drain electrode 20 includes a drain electrode portion 20a and a backside surface protecting electrode 20b. Drain electrode portion 20a is provided in contact with fourth main surface 10b of silicon carbide substrate 10. Drain electrode portion 20a is made of a material such as NiSi (nickel silicide), which is capable of making ohmic contact with n type silicon carbide single-crystal substrate 11. Backside surface protecting electrode 20b is electrically connected to drain electrode portion 20a.

Figure 4:
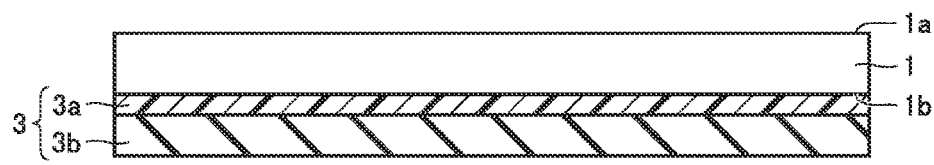
FIG. 4 is a schematic sectional view showing a second step of the method of manufacturing the silicon carbide semiconductor device according to the embodiment of the present invention.

Next, a step of affixing an adhesive tape (S20: FIG. 1) is performed. As shown in FIG. 4, an adhesive tape 3 is affixed, for example, to second main surface 1b of silicon carbide wafer 1. Adhesive tape 3 may be affixed to first main surface 1a of silicon carbide wafer 1. In other words, adhesive tape 3 is affixed to one of first main surface 1a and second main surface 1b of silicon carbide wafer 1. The adhesive tape has an adhesive portion 3a in contact with one of first main surface 1a and second main surface 1b, and a base material 3b located opposite to the one of the surfaces as seen from adhesive portion 3a.

An acrylic adhesive agent having adhesion property, for example, can be used as adhesive portion 3a. An organic compound such as polyester can be used as base material 3b. A material having an adhesive strength that decreases when irradiated with energy rays such as ultraviolet rays may be used as adhesive portion 3a. Examples of materials having an adhesive strength that decreases when irradiated with energy rays such as ultraviolet rays include an ultraviolet curing type resin. Alternatively, a material having an adhesive strength that decreases when heated may be used as adhesive portion 3a. Examples of materials having an adhesive strength that decreases when heated include a heat curing type resin. It is noted that the step of affixing the adhesive tape (S20: FIG. 1) is performed after the step of preparing the silicon carbide wafer (S10: FIG. 1) and before a first cutting step (S30: FIG. 1).

Figure 5:
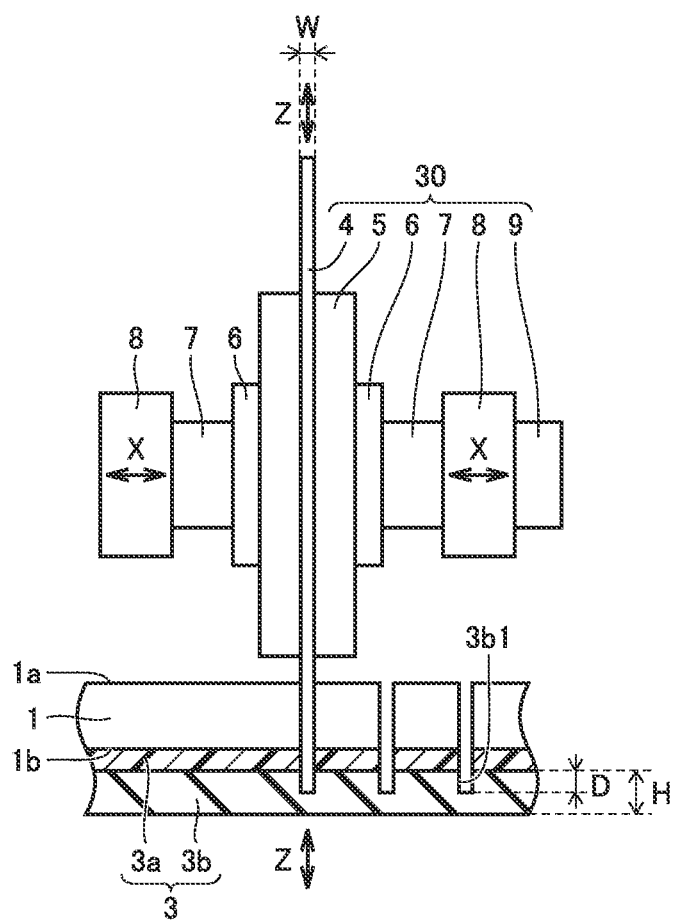
FIG. 5 is a partial schematic sectional view of a third step of the method of manufacturing the silicon carbide semiconductor device according to the embodiment of the present invention, as seen along a direction parallel to the cutting plane.
Figure 6:
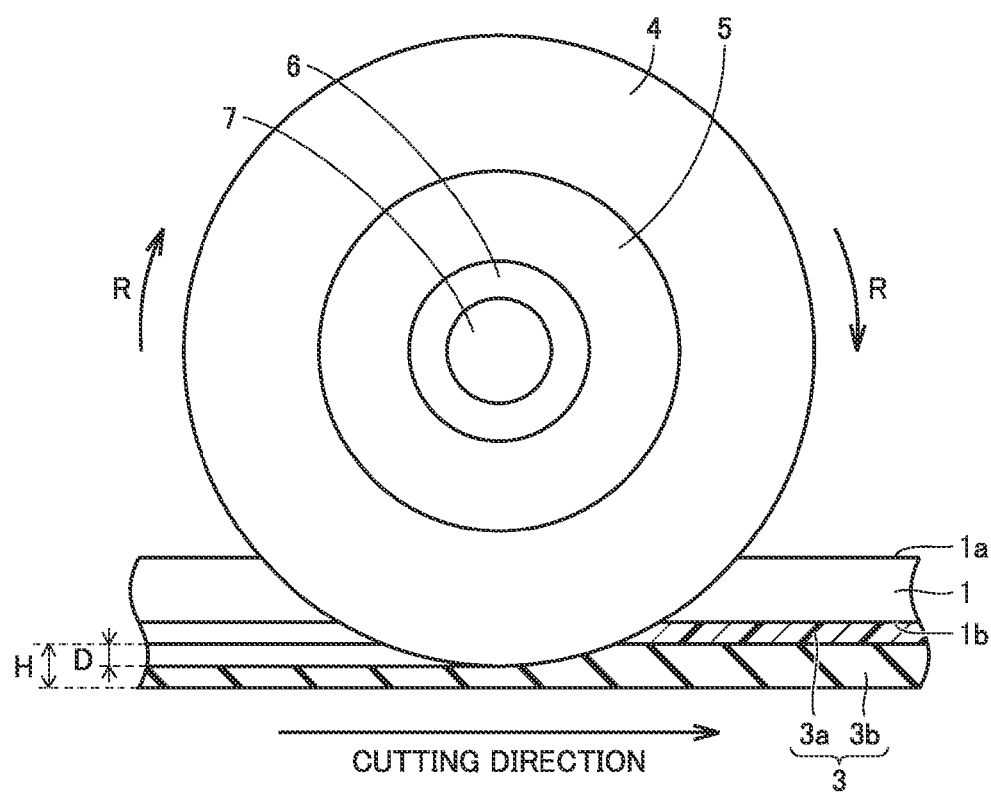
FIG. 6 is a partial schematic sectional view of the third step of the method of manufacturing the silicon carbide semiconductor device according to the embodiment of the present invention, as seen along a direction perpendicular to the cutting plane.

Next, the first cutting step (S30: FIG. 1) is performed. As shown in FIG. 5, a dicing device 30 is prepared. Dicing device 30 mainly has blade 4, a hone 5, a first shaft 6, a second shaft 7, an ultrasonic spindle 8, and a motor 9. Blade 4 is secured by being sandwiched between hones 5. Blade 4 has a width W of not less than 50 μm and not more than 100 μm, for example. Hone 5 is connected to first shaft 6. First shaft 6 is connected to second shaft 7. Second shaft 7 is connected to ultrasonic spindle 8. Ultrasonic spindle 8 oscillates in a direction (x direction) perpendicular to the plane of rotation of blade 4. As ultrasonic spindle 8 oscillates in the x direction, blade 4 repeats extension and contraction in the x direction. Blade 4 thereby repeats extension and contraction in a direction (z direction) parallel to the plane of rotation of blade 4. Motor 9 is connected to second shaft 7 and configured to be able to rotate blade 4. As shown in FIG. 6, blade 4 is configured to be able to rotate in a direction of rotation R around second shaft 7.

As shown in FIGS. 5 and 6, in the first cutting step, blade 4 comes into contact with silicon carbide wafer 1 while rotating around second shaft 7, to cut silicon carbide wafer 1. Stated another way, silicon carbide wafer 1 is cut by rotating blade 4. Blade 4 penetrates silicon carbide wafer 1 and adhesive portion 3a, and cuts a portion of base material 3b. Stated another way, an incision 3b1 is formed in base material 3b. A depth D of incision 3b is not less than 15% and not more than 50% of a thickness H of base material 3b, for example, and preferably not less than 20% and not more than 30% of thickness H of base material 3b.

Preferably, in the first cutting step, a cutting speed of silicon carbide wafer 1 in the direction parallel to first main surface 1a of silicon carbide wafer 1 is not less than 1 mm/second and not more than 40 mm/second, and more preferably not less than 10 mm/second and not more than 20 mm/second. The cutting speed of silicon carbide wafer 1 is obtained by dividing a cutting length in the cutting direction parallel to first main surface 1a of silicon carbide wafer 1 by a cutting time. Preferably, in the first cutting step, a rotational speed of blade 4 is not less than 5000 rpm and not more than 50000 rpm, and more preferably not less than 8000 rpm and not more than 20000 rpm.

As shown in FIG. 6, in the step of cutting silicon carbide wafer 1, silicon carbide wafer 1 moves in the direction parallel to the plane of rotation of blade 4, for example. Silicon carbide wafer 1 is thus cut from one end to the other end of first main surface 1a in plan view. In the step of cutting silicon carbide wafer 1, one of silicon carbide wafer 1 and blade 4 moves relative to the other. Silicon carbide wafer 1 may be cut, for example, by securing blade 4 within first main surface 1a of silicon carbide wafer 1 and moving silicon carbide wafer 1 in the direction parallel to first main surface 1a. Silicon carbide wafer 1 may be cut, conversely, by securing silicon carbide wafer 1 within first main surface 1a of silicon carbide wafer 1 and moving blade 4 in the direction parallel to first main surface 1a.

Figure 7:
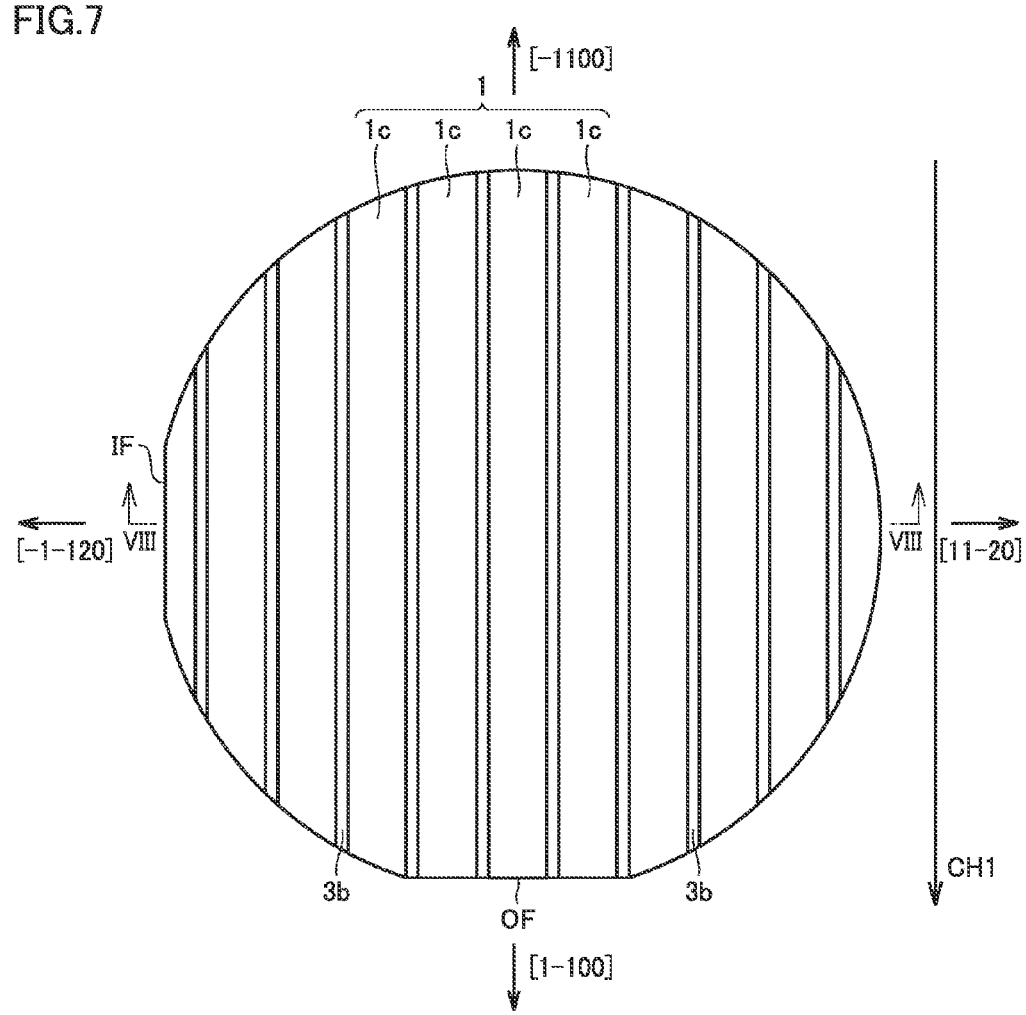
FIG. 7 is a schematic plan view showing the configuration of a silicon carbide wafer after completion of a first cutting step.
Figure 8:
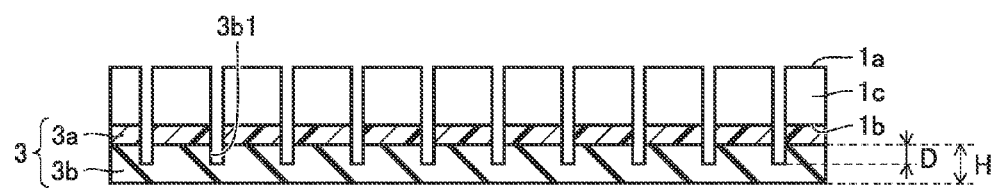
FIG. 8 is a schematic sectional view showing the configuration of the silicon carbide wafer after completion of the first cutting step.

As shown in FIG. 7, in the first cutting step, silicon carbide wafer 1 is cut along a plane substantially parallel to a {11-20} plane. Stated another way, silicon carbide wafer 1 is cut substantially along the <1-100> direction. Preferably, silicon carbide wafer 1 is cut along a plane substantially parallel to any one of a (11-20) plane, a (-2110) plane and a (1-210) plane. It is noted that the (11-20) plane, the (-2110) plane and the (1-210) plane are crystallographically equivalent planes. Preferably, silicon carbide wafer 1 is cut along a direction substantially parallel to one of a [1-100] direction and a [-1100] direction. It is noted that the (11-20) plane is a plane perpendicular to the [11-20] direction.

As shown in FIG. 7, in the first cutting step, silicon carbide wafer 1 may be cut in a direction CH1 from the side opposite to orientation flat OF toward orientation flat OF as seen from the center of first main surface 1a of silicon carbide wafer 1. Conversely, silicon carbide wafer 1 may be cut from the orientation flat OF side to the side opposite to orientation flat OF. As shown in FIG. 7, the entire silicon carbide wafer 1 is cut at a prescribed interval. A plurality of strip-like pieces 1c are thus formed as seen along a direction perpendicular to first main surface 1a. The direction of the major axis of each of the plurality of pieces 1c is a direction parallel to the direction in which index flat IF extends, for example. The direction of the minor axis of each of the plurality of pieces 1c is a direction parallel to the direction in which orientation flat OF extends, for example.

Figure 9:
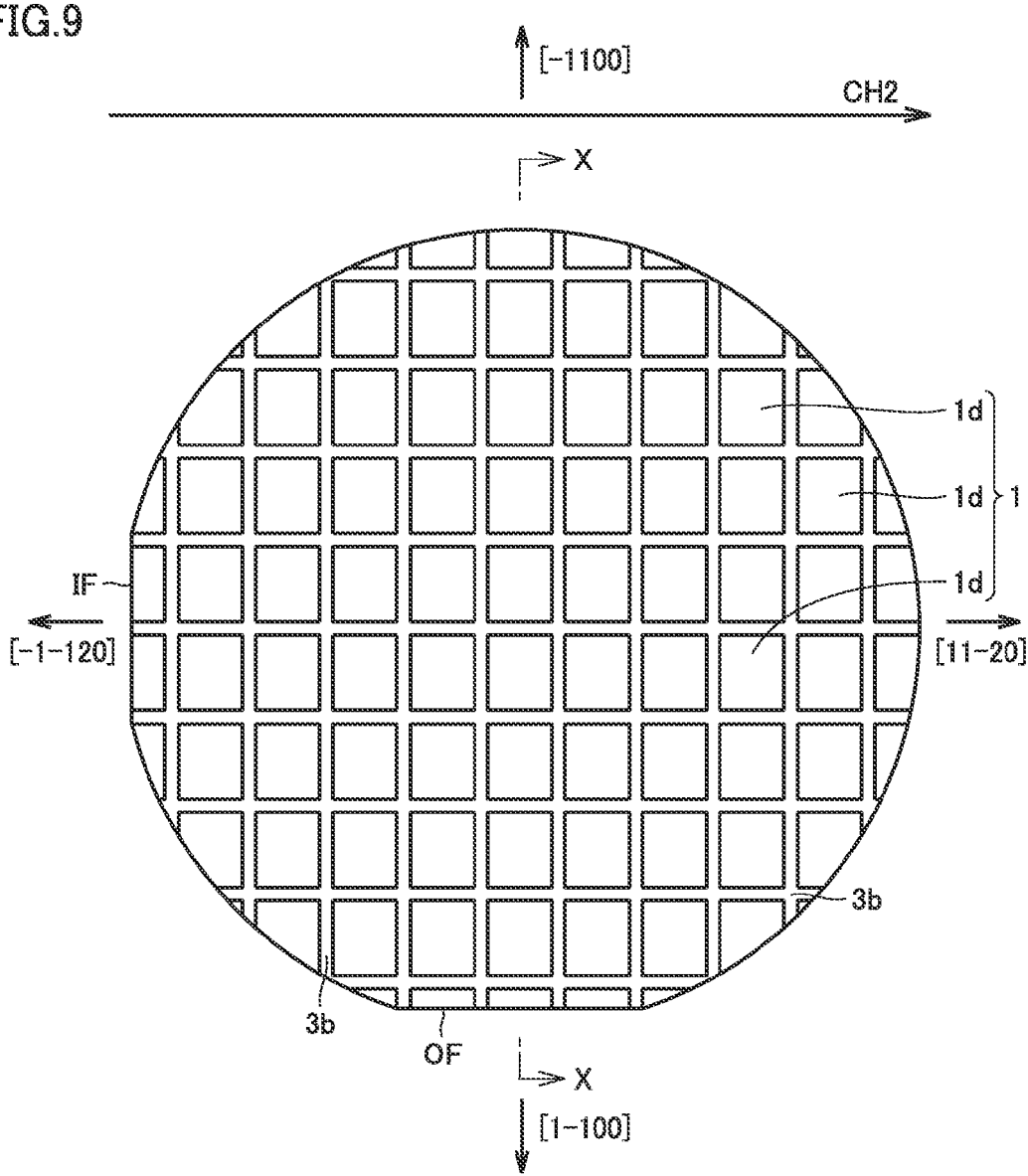
FIG. 9 is a schematic plan view showing the configuration of the silicon carbide wafer after completion of a second cutting step.
Figure 10:
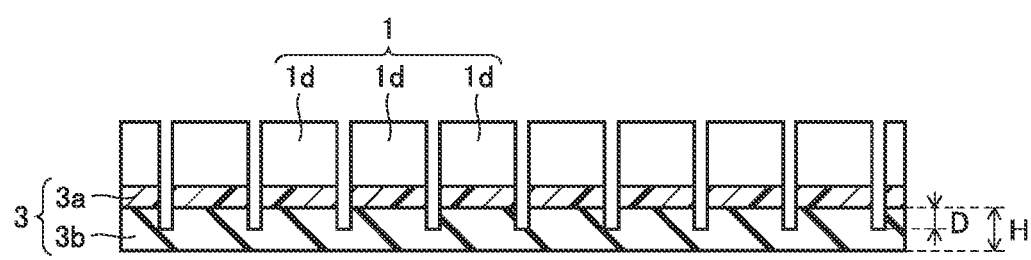
FIG. 10 is a schematic sectional view showing the configuration of the silicon carbide wafer after completion of the second cutting step.

Next, a second cutting step (S40: FIG. 1) is performed. As shown in FIG. 9, after the first cutting step, silicon carbide wafer 1 is cut along a plane substantially perpendicular to the {11-20} plane and substantially perpendicular to first main surface 1a. Stated another way, silicon carbide wafer 1 is cut substantially along the <11-20> direction. Preferably, silicon carbide wafer 1 is cut along a plane substantially parallel to a {1-100} plane. Preferably, silicon carbide wafer 1 is cut along a plane substantially parallel to any one of a (1-100) plane, a (01-10) plane and a (-1010) plane. It is noted that the (1-100) plane, the (01-10) plane and the (-1010) plane are crystallographically equivalent planes. Preferably, silicon carbide wafer 1 is cut along a direction substantially parallel to one of a [11-20] direction and a [-1-120] direction. It is noted that the (1-100) plane is a plane perpendicular to the [1-100] direction.

As shown in FIGS. 5, 6, 9 and 10, in the second cutting step, blade 4 comes into contact with silicon carbide wafer 1 while rotating around second shaft 7, to cut silicon carbide wafer 1. Stated another way, silicon carbide wafer 1 is cut by rotating blade 4. Blade 4 penetrates silicon carbide wafer 1 and adhesive portion 3a, and cuts a portion of base material 3b. Stated another way, incision 3b1 is formed in base material 3b. Depth D of incision 3b is not less than 15% and not more than 50% of thickness H of base material 3b, for example, and preferably not less than 20% and not more than 30% of thickness H of base material 3b.

Preferably, in the second cutting step, a cutting speed of silicon carbide wafer 1 in the direction parallel to first main surface 1a of silicon carbide wafer 1 is not less than 1 mm/second and not more than 40 mm/second, and more preferably not less than 10 mm/second and not more than 20 mm/second. The cutting speed of silicon carbide wafer 1 is obtained by dividing a cutting length in the cutting direction parallel to first main surface 1a of silicon carbide wafer 1 by a cutting time. Preferably, in the second cutting step, a rotational speed of blade 4 is not less than 5000 rpm and not more than 50000 rpm, and more preferably not less than 8000 rpm and not more than 20000 rpm.

As shown in FIG. 9, in the second cutting step, silicon carbide wafer 1 may be cut in a direction CH2 from index flat IF to the side opposite to index flat IF as seen from the center of first main surface 1a of silicon carbide wafer 1. Conversely, silicon carbide wafer 1 may be cut from the side opposite to index flat IF toward index flat IF as seen from the center of first main surface 1a of silicon carbide wafer 1. As shown in FIG. 9, in the second cutting step, all of the plurality of pieces 1c (see FIG. 7) are cut at a prescribed interval. A plurality of chips 1d are thus formed. When seen along the direction perpendicular to first main surface 1a of silicon carbide wafer 1, the outer shape of each chip 1d is a quadrangular shape, for example, and preferably a rectangular shape or a square shape.

Figure 11:
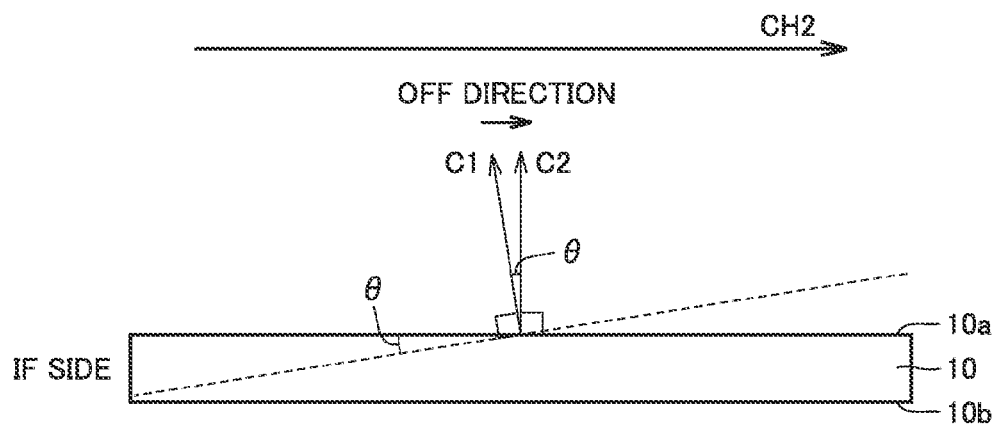
FIG. 11 is a schematic side view of a silicon carbide substrate for illustrating an off direction.

As shown in FIG. 11, first main surface 1a of silicon carbide wafer 1 may be a plane angled off by not less than 3° and not more than 5° relative to the {0001} plane toward the off direction. Preferably, third main surface 10a of silicon carbide substrate 10 included in silicon carbide wafer 1 is a plane angled off by not less than 3° and not more than 5° relative to the {0001} plane toward the off direction. Preferably, in the second cutting step, silicon carbide wafer 1 is cut substantially toward the off direction.

In FIG. 11, a plane indicated by a broken line is the {0001} plane, and preferably the (0001) plane. A direction C1 is a <0001> direction, and preferably a [0001] direction. Third main surface 10a of silicon carbide substrate 10 is a plane angled off by an off angle θ relative to the {0001} plane (plane indicated by the broken line), for example. In FIG. 11, a direction C2 is a direction perpendicular to third main surface 10a of silicon carbide substrate 10. The off direction is a direction in which direction C1 is inclined toward direction C2. If direction C2 is a direction inclined from the <0001> direction toward the <11-20> direction, for example, then the off direction is the <11-20> direction.

Figure 12:
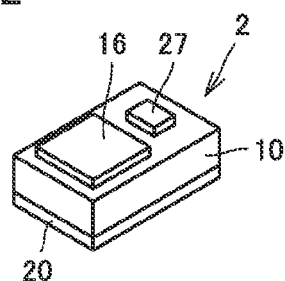
FIG. 12 is a schematic perspective view showing the configuration of the silicon carbide semiconductor device.

Next, a step of removing the adhesive tape (S50: FIG. 1) is performed. In the case where a material having an adhesive strength that decreases when irradiated with ultraviolet rays is used as adhesive portion 3a of adhesive tape 3, for example, adhesive portion 3a is irradiated with ultraviolet rays. The adhesive strength of adhesive portion 3a thus decreases. Then, chips 1d are removed from adhesive portion 3a of adhesive tape 3. Each chip 1d includes at least one or more semiconductor elements 2a, and constitutes a silicon carbide semiconductor device 2. The manufacture of silicon carbide semiconductor device 2 is thus completed. As shown in FIG. 12, a MOSFET 2 as silicon carbide semiconductor device 2 includes silicon carbide substrate 10, source electrode 16, gate electrode 27, and drain electrode 20.

Next, variations of the method of manufacturing the silicon carbide semiconductor device according to the present embodiment will be described.

Figure 13:
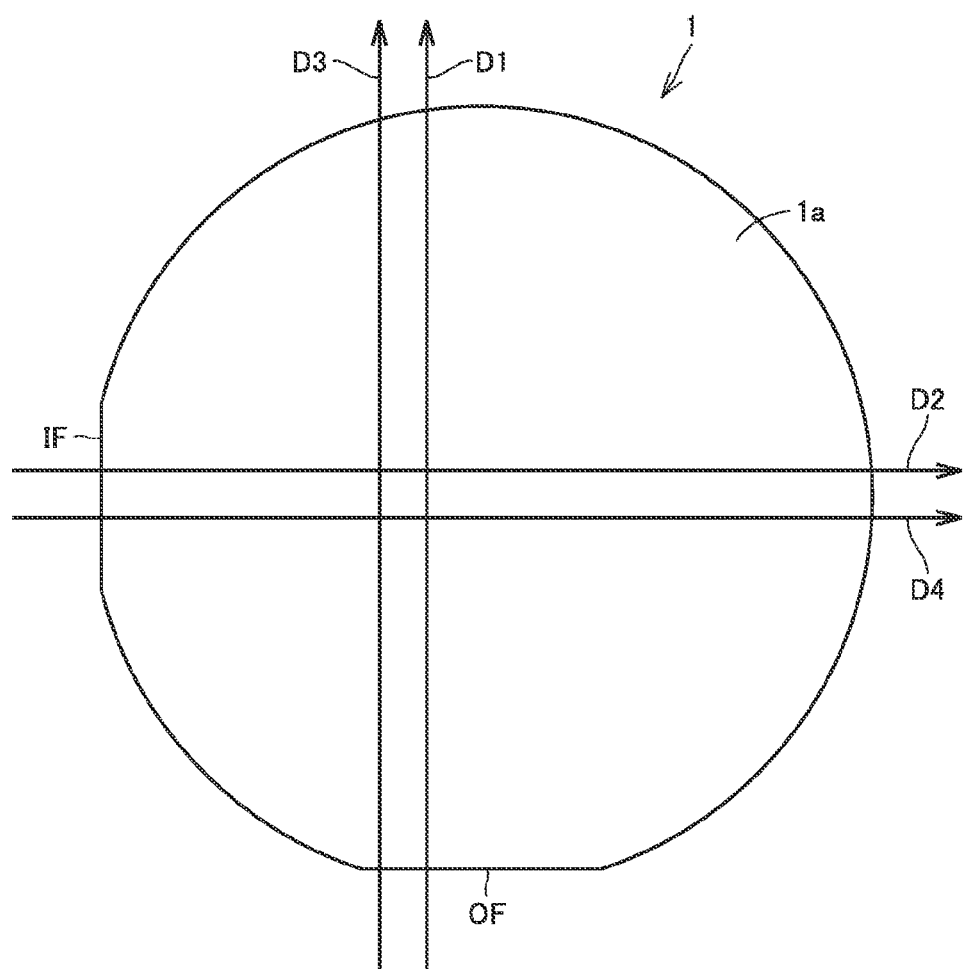
FIG. 13 is a schematic plan view showing a variation of the method of manufacturing the silicon carbide semiconductor device according to the embodiment of the present invention.

During the cutting of silicon carbide wafer 1, the first cutting step (S30: FIG. 1) and the second cutting step (S40: FIG. 1) may be alternately repeated. As shown in FIG. 13, in a first cutting step D1, silicon carbide wafer 1 is cut along the plane substantially parallel to the {11-20} plane. Silicon carbide wafer 1 is cut from the orientation flat OF side to the side opposite to orientation flat OF, for example. Silicon carbide wafer 1 is thus separated into two pieces. Then, in a second cutting step D2, silicon carbide wafer 1 is cut along the plane substantially perpendicular to the {11-20} plane and substantially perpendicular to first main surface 1a. Silicon carbide wafer 1 is cut in the direction from index flat IF to the side opposite to index flat IF as seen from the center of first main surface 1a of silicon carbide wafer 1. Silicon carbide wafer 1 is thus separated into four pieces.

Then, in a third cutting step D3, silicon carbide wafer 1 is cut along the plane substantially parallel to the {11-20} plane. At a position shifted by a certain distance toward index flat IF, for example, from the region that was cut in the first cutting step, silicon carbide wafer 1 is cut from the orientation flat OF side to the side opposite to orientation flat OF, for example. Silicon carbide wafer 1 is thus separated into six pieces. Then, in a fourth cutting step D4, silicon carbide wafer 1 is cut along the plane substantially perpendicular to the {11-20} plane and substantially perpendicular to first main surface 1a. At a position shifted by a certain distance toward orientation flat OF, for example, from the region that was cut in the second cutting step, silicon carbide wafer 1 is cut in the direction from index flat IF to the side opposite to index flat IF as seen from the center of first main surface 1a of silicon carbide wafer 1. As described above, the first cutting step and the second cutting step may be alternately repeated to cut silicon carbide wafer 1. Alternatively, after the first cutting step is performed multiple times, the second cutting step may be performed multiple times.

Although the first conductivity type has been described as n type and the second conductivity type as p type in the above embodiment, the first conductivity type may be p type and the second conductivity type may be n type. Although the planar type MOSFET has been described as an example semiconductor element, the semiconductor element may be a trench type MOSFET. Alternatively, the semiconductor element may be a diode, an IGBT (Insulated Gate Bipolar Transistor), a JFET (Junction Field Effect Transistor) and the like.

Next, the function and effect of the method of manufacturing the silicon carbide semiconductor device according to the present embodiment will be described.

In accordance with the following step of the method of manufacturing MOSFET 2 according to the present embodiment, the first cutting step of cutting silicon carbide wafer 1 along the plane substantially parallel to the {11-20} plane is performed. After the first cutting step, the second cutting step of cutting silicon carbide wafer 1 along the plane substantially perpendicular to the {11-20} plane and substantially perpendicular to the first main surface is performed. Consequently, in the second cutting step, the chips are formed by cutting silicon carbide wafer 1 mechanically by the blade, instead of cutting silicon carbide wafer 1 by utilizing the cleavage plane, thereby preventing the chips from being caught in the blade to cause chipping.

In accordance with the following step of the method of manufacturing MOSFET 2 according to the present embodiment, first main surface 1a is a plane angled off by not less than 3° and not more than 5° relative to the {0001} plane toward the off direction. In the second cutting step, silicon carbide wafer 1 is cut substantially toward the off direction. Consequently, wear of the blade due to a surface step can be avoided, thereby further suppressing the occurrence of chipping caused by a distortion or a burr of the blade associated with the wear of the blade.

Further, in accordance with the following step of the method of manufacturing MOSFET 2 according to the present embodiment, in each of the first cutting step and the second cutting step, the cutting speed of silicon carbide wafer 1 in the direction parallel to first main surface 1a is not less than 1 mm/second and not more than 40 mm/second. By setting the cutting speed of silicon carbide wafer 1 to not less than 1 mm/second, the force on silicon carbide wafer 1 can be reduced, thereby preventing chips 1d from being caught in blade 4. By setting the cutting speed of silicon carbide wafer 1 to not more than 40 mm/second, deterioration of blade 4 can be suppressed.

Further, in accordance with the following step of the method of manufacturing MOSFET 2 according to the present embodiment, in each of the first cutting step and the second cutting step, silicon carbide wafer 1 is cut by rotating blade 4. The rotational speed of blade 4 is not less than 5000 rpm and not more than 50000 rpm. By setting the rotational speed of blade 4 to not less than 5000 rpm, the force on silicon carbide wafer 1 can be reduced, thereby preventing chips 1d from being caught in blade 4. By setting the rotational speed of blade 4 to not more than 50000 rpm, deterioration of blade 4 can be suppressed.

Further, in accordance with the following step of the method of manufacturing MOSFET 2 according to the present embodiment, the method further includes the step of, after the step of preparing silicon carbide wafer 1 and before the first cutting step, affixing adhesive tape 3 to one of first main surface 1a and second main surface 1b. Adhesive tape 3 has adhesive portion 3a in contact with the one of the surfaces, and base material 3b located opposite to the one of the surfaces as seen from adhesive portion 3a. In each of the first cutting step and the second cutting step, incision 3b1 having a depth of not less than 15% and not more than 50% of the thickness of base material 3b is formed in the base material. By setting the depth of incision 3b1 formed in base material 3b to not less than 15% of the thickness of base material 3b, the occurrence of an uncut portion in silicon carbide wafer 1 can be suppressed. Increasing the depth of incision 3b1 formed in base material 3b increases the distance between chips 1d in the direction parallel to first main surface 1a. The actual cutting position may thereby be displaced from a planned cutting position. By setting depth D of incision 3b1 formed in base material 3b to not more than 50% of the thickness of base material 3b, the displacement of the actual cutting position from the planned cutting position can be suppressed.

Further, in accordance with the following step of the method of manufacturing MOSFET 2 according to the present embodiment, in the first cutting step, the entire silicon carbide wafer 1 is cut at the prescribed interval to form the plurality of strip-like pieces 1c as seen along the direction perpendicular to the first main surface. In the second cutting step, all of the plurality of pieces 1c are cut at the prescribed interval to form the plurality of chips 1d. Silicon carbide wafer 1 can thus be separated into chips 1d in a short period of time.

Further, in accordance with the following step of the method of manufacturing MOSFET 2 according to the present embodiment, the first cutting step and the second cutting step are alternately repeated. Chips 1d of any size can thus be formed with any cutting method, thereby increasing the flexibility of the cutting method.

EXAMPLE

Silicon carbide wafers 1 were cut using a cutting method according to an example and a cutting method according to a comparative example, to compare the rate of occurrence of chipping in the case where silicon carbide wafers 1 were cut with the cutting method according to the example and the rate of occurrence of chipping in the case where silicon carbide wafers 1 were cut with the cutting method according to the comparative example. In the cutting method according to the example, silicon carbide wafer 1 was cut at a prescribed pitch along a direction perpendicular to the [11-20] direction (first cutting step), to form a plurality of strip-like pieces. Then, the strip-like pieces were cut at a prescribed pitch along a direction parallel to the [11-20] direction (second cutting step), to form a plurality of chips. A total of 42 silicon carbide wafers 1 were cut using the cutting method according to the example. Each silicon carbide wafer 1 was examined under an optical microscope to determine whether or not chipping had occurred in the chip. With a sequence of chips parallel to the cutting plane in the second cutting step as one line, total inspection was carried out on the chips for every fifth line. When one or more chippings were observed in first main surface 1a of silicon carbide wafer 1, it was determined that the chipping had occurred in the wafer.

In the cutting method according to the comparative example, silicon carbide wafer 1 was cut at a prescribed pitch along the direction parallel to the [11-20] direction (second cutting step), to form a plurality of strip-like pieces. Then, the strip-like pieces were cut at a prescribed pitch along the direction perpendicular to the [11-20] direction (first cutting step), to form a plurality of chips. A total of 11 silicon carbide wafers 1 were cut using the cutting method according to the comparative example. Each silicon carbide wafer 1 was examined under an optical microscope to determine whether or not chipping had occurred in the chip. With a sequence of chips parallel to the cutting plane in the first cutting step as one line, total inspection was carried out on the chips for every fifth line. When one or more chippings were observed in first main surface 1a of silicon carbide wafer 1, it was determined that the chipping had occurred in the wafer.

TABLE 1

| Order of cutting | Number processed | Number of occurrence of chipping [times] | Rate of occurrence of chipping [%] |
|---|---|---|---|
| Second cutting step → First cutting step | 11 | 8 | 72.7 |
| First cutting step → Second cutting step | 42 | 8 | 19.0 |

Table 1 shows a relationship between the method of cutting the silicon carbide wafer and the rate of occurrence of chipping. According to the cutting method of the example (first cutting step→second cutting step), chipping of the chip was confirmed in eight of the 42 silicon carbide wafers. That is, the rate of occurrence of chipping was 8/42×100=19.0%. According to the cutting method of the comparative example (second cutting step→first cutting step), on the other hand, chipping of the chip was confirmed in eight of the total of 11 silicon carbide wafers. That is, the rate of occurrence of chipping was 8/11×100=72.7%. From the above results, it was demonstrated that the cutting method of initially cutting silicon carbide wafer 1 along the direction perpendicular to the [11-20] direction (first cutting step), and then cutting silicon carbide wafer 1 along the direction parallel to the [11-20] direction (second cutting step) could significantly reduce the rate of occurrence of chipping, as compared to the cutting method of initially cutting silicon carbide wafer 1 along the direction parallel to the [11-20] direction (second cutting step), and then cutting silicon carbide wafer 1 along the direction perpendicular to the [11-20] direction (first cutting step).

It should be understood that the embodiments and examples disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 1 silicon carbide wafer; 1a first main surface; 1b second main surface; 1c piece; 1d chip; 2 silicon carbide semiconductor device (MOSFET); 2a semiconductor element; 3 adhesive tape; 3a adhesive portion; 3b base material; 4 blade; 5 hone; 6 first shaft; 7 second shaft; 8 ultrasonic spindle; 9 motor; 10 silicon carbide substrate; 10a third main surface; 10b fourth main surface; 11 silicon carbide single-crystal substrate; 12 drift region; 13 body region; 14 source region; 15 gate oxide film; 16 source electrode; 16a source electrode portion; 16b surface protecting electrode; 17 silicon carbide epitaxial layer; 18 contact region; 20 drain electrode; 20a drain electrode portion; 20b backside surface protecting electrode; 21 interlayer insulating film; 27 gate electrode; 30 dicing device; 50 dicing line; 50a first dicing line; 50b second dicing line; C1, C2, CH1, CH2 direction; D depth; D1, D2, D3, D4 cutting step; H thickness; IF index flat; OF orientation flat; R direction of rotation; W width.

The invention claimed is:

1. A method of manufacturing a silicon carbide semiconductor device, comprising:
   preparing a silicon carbide wafer having a first main surface and a second main surface opposite to the first main surface;
   a first cutting step of cutting the silicon carbide wafer along a plane substantially parallel to a {11-20} plane;
   after the first cutting step, a second cutting step of cutting the silicon carbide wafer along a plane substantially perpendicular to the {11-20} plane and substantially perpendicular to the first main surface; and
   after the preparing a silicon carbide wafer and before the first cutting step, affixing an adhesive tape to one of the first main surface and the second main surface, wherein
   the adhesive tape has an adhesive portion in contact with the one of the surfaces, and a base material located opposite to the one of the surfaces as seen from the adhesive portion, and
   in each of the first cutting step and the second cutting step, an incision having a depth of not less than 15% and not more than 50% of a thickness of the base material is formed in the base material.

2. The method of manufacturing a silicon carbide semiconductor device according to claim 1, wherein
   the first main surface is a plane angled off by not less than 3° and not more than 5° relative to a {0001} plane toward an off direction, and
   in the second cutting step, the silicon carbide wafer is cut substantially toward the off direction.

3. The method of manufacturing a silicon carbide semiconductor device according to claim 1, wherein
   in each of the first cutting step and the second cutting step, a cutting speed of the silicon carbide wafer in a direction parallel to the first main surface is not less than 1 mm/second and not more than 40 mm/second.

4. The method of manufacturing a silicon carbide semiconductor device according to claim 1, wherein
   in each of the first cutting step and the second cutting step, the silicon carbide wafer is cut by a rotating blade, and
   a rotational speed of the blade is not less than 5000 rpm and not more than 50000 rpm.

5. The method of manufacturing a silicon carbide semiconductor device according to claim 1, wherein
   in the first cutting step, the entire silicon carbide wafer is cut at a prescribed interval to form a plurality of strip-like pieces as seen along a direction perpendicular to the first main surface, and
   in the second cutting step, all of the plurality of pieces are cut at a prescribed interval to form a plurality of chips.

6. The method of manufacturing a silicon carbide semiconductor device according to claim 1, wherein
   the first cutting step and the second cutting step are alternately repeated.

7. A method of manufacturing a silicon carbide semiconductor device, comprising:
   preparing a silicon carbide wafer having a first main surface and a second main surface opposite to the first main surface;
   after the preparing a silicon carbide wafer, affixing an adhesive tape to the second main surface;
   after the affixing an adhesive tape to the second main surface, a first cutting step of cutting the silicon carbide wafer along a plane substantially parallel to a {11-20} plane;
   after the first cutting step, a second cutting step of cutting the silicon carbide wafer along a plane substantially perpendicular to the {11-20} plane and substantially perpendicular to the first main surface; and after the second cutting step, removing the adhesive tape from the silicon carbide wafer, the adhesive tape having an adhesive portion in contact with the second main surface, and a base material located opposite to the second main surface as seen from the adhesive portion, in each of the first cutting step and the second cutting step, an incision being formed in the base material.

* * * * *